United States Patent [19]

Takenaka et al.

[11] Patent Number: 5,122,387
[45] Date of Patent: Jun. 16, 1992

[54] DEVELOPING SOLUTION AND PATTERN FORMING METHOD USING THE SAME

[75] Inventors: Hiroshi Takenaka, Nagaokakyo; Yoshihiro Todokoro, Kyoto, both of Japan

[73] Assignee: Matsushita Electronics Corporation, Osaka, Japan

[21] Appl. No.: 442,981

[22] Filed: Nov. 28, 1989

[30] Foreign Application Priority Data

Nov. 28, 1988 [JP] Japan ................. 63-299866
Aug. 21, 1989 [JP] Japan ................. 1-214377

[51] Int. Cl.⁵ ................ B05D 3/06; G03C 5/00
[52] U.S. Cl. ...................... 427/35; 427/36; 427/43.1; 427/54.1; 427/38; 430/296; 430/312; 430/324
[58] Field of Search ........... 427/35, 36, 38, 54.1, 427/43.1; 430/296, 312, 324, 325, 326

[56] References Cited

U.S. PATENT DOCUMENTS

| | | | |
|---|---|---|---|
| 3,964,908 | 6/1976 | Bargon et al. | 430/326 |
| 4,212,935 | 7/1980 | Canavello et al. | 430/326 |
| 4,384,037 | 5/1983 | Hosaka et al. | 430/326 |
| 4,415,652 | 11/1983 | Proskow | 430/287 |
| 4,524,121 | 6/1985 | Gleim et al. | 430/326 |
| 4,536,421 | 8/1985 | Matsuzawa et al. | 430/326 |
| 4,693,954 | 9/1987 | Naito | 430/220 |
| 4,699,870 | 10/1987 | Iwadate et al. | 430/326 |
| 4,725,524 | 2/1988 | Elzer et al. | 430/287 |
| 4,737,438 | 4/1988 | Ito et al. | 430/197 |
| 4,770,739 | 9/1988 | Orvek et al. | 430/318 |
| 4,791,171 | 12/1988 | Cunningham | 526/279 |
| 4,814,258 | 3/1989 | Tam | 430/324 |
| 4,833,067 | 5/1989 | Tanaka et al. | 430/325 |
| 4,873,177 | 10/1989 | Tahaka et al. | 430/326 |
| 4,912,018 | 3/1990 | Osuch et al. | 430/325 |
| 4,939,070 | 7/1990 | Brunsvold et al. | 430/325 |
| 4,957,988 | 9/1990 | Irving et al. | 526/259 |

Primary Examiner—Marianne Padgett
Attorney, Agent, or Firm—Wenderoth, Lind & Ponack

[57] ABSTRACT

The invention relates to a developing solution of polydimethyl glutarimide containing acetone, ethyl alcohol, or propyl alcohol and, water, and alkali, and a pattern forming method using the same. According to the invention, a finer pattern than before may be formed by using PMGI resist film. At the same time, a liftoff process excellent in dimensional controllability and high in reliability than in the prior art will be realized. Besides, in the wet etching process of using the two-layer resist pattern of the invention as the mask on the GaAs substrate, since the adhesion of the lower layer resist to the substrate is superior, the recess width when etching the substrate can be stably controlled, so that a device of high performance may be obtained. Furthermore, in the process of using the PMGI resist film in the lower layer and the PMMA resist film in the upper layer, since the PMMA resist film and PMGI resist film possess mutually appropriate electron beam sensitivity and deep ultraviolet light sensitivity, mixed exposure by electron beam and deep ultraviolet light may be applied, so that a stable hybrid exposure may be effected at a high through-put.

11 Claims, 14 Drawing Sheets

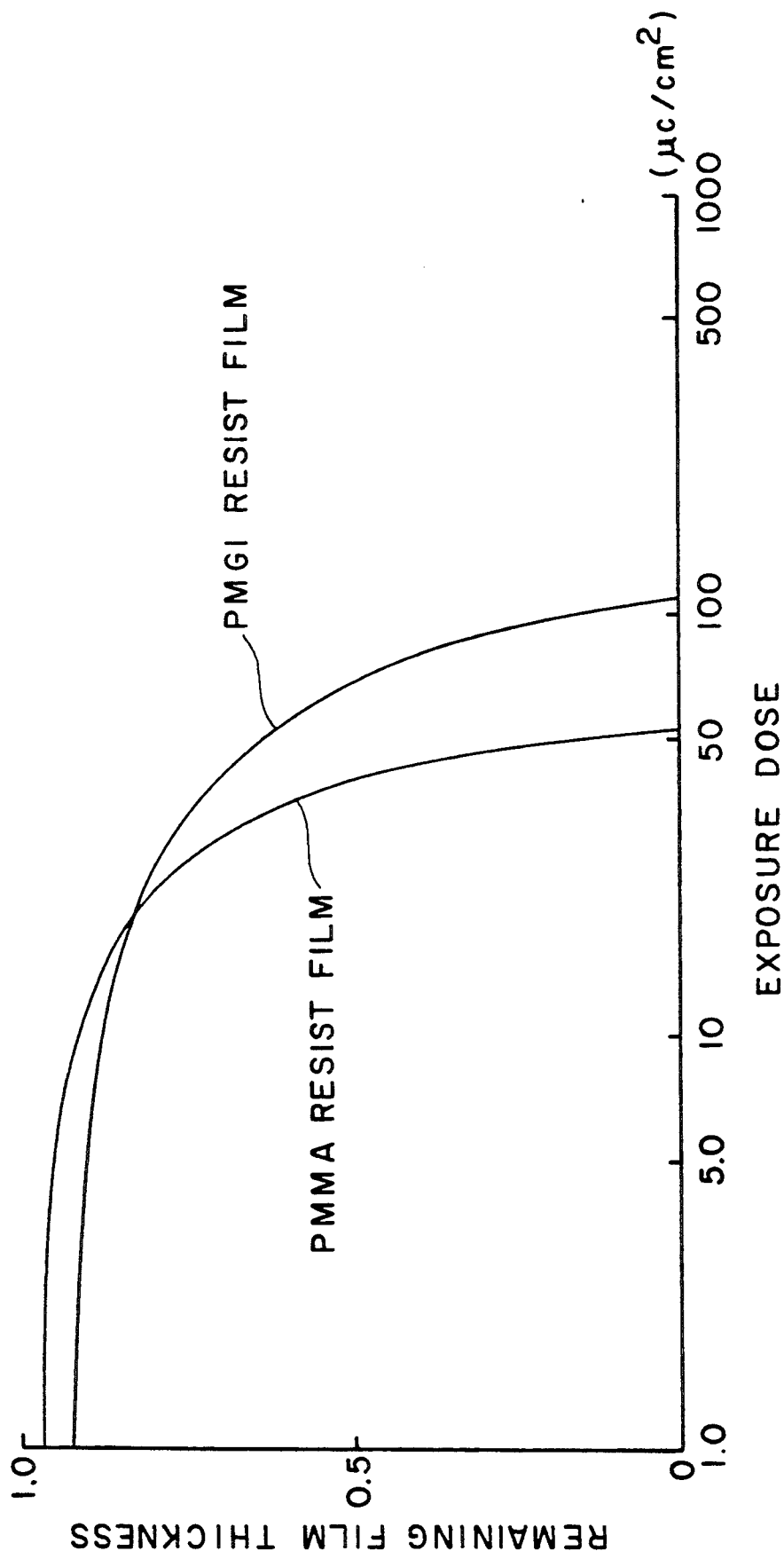

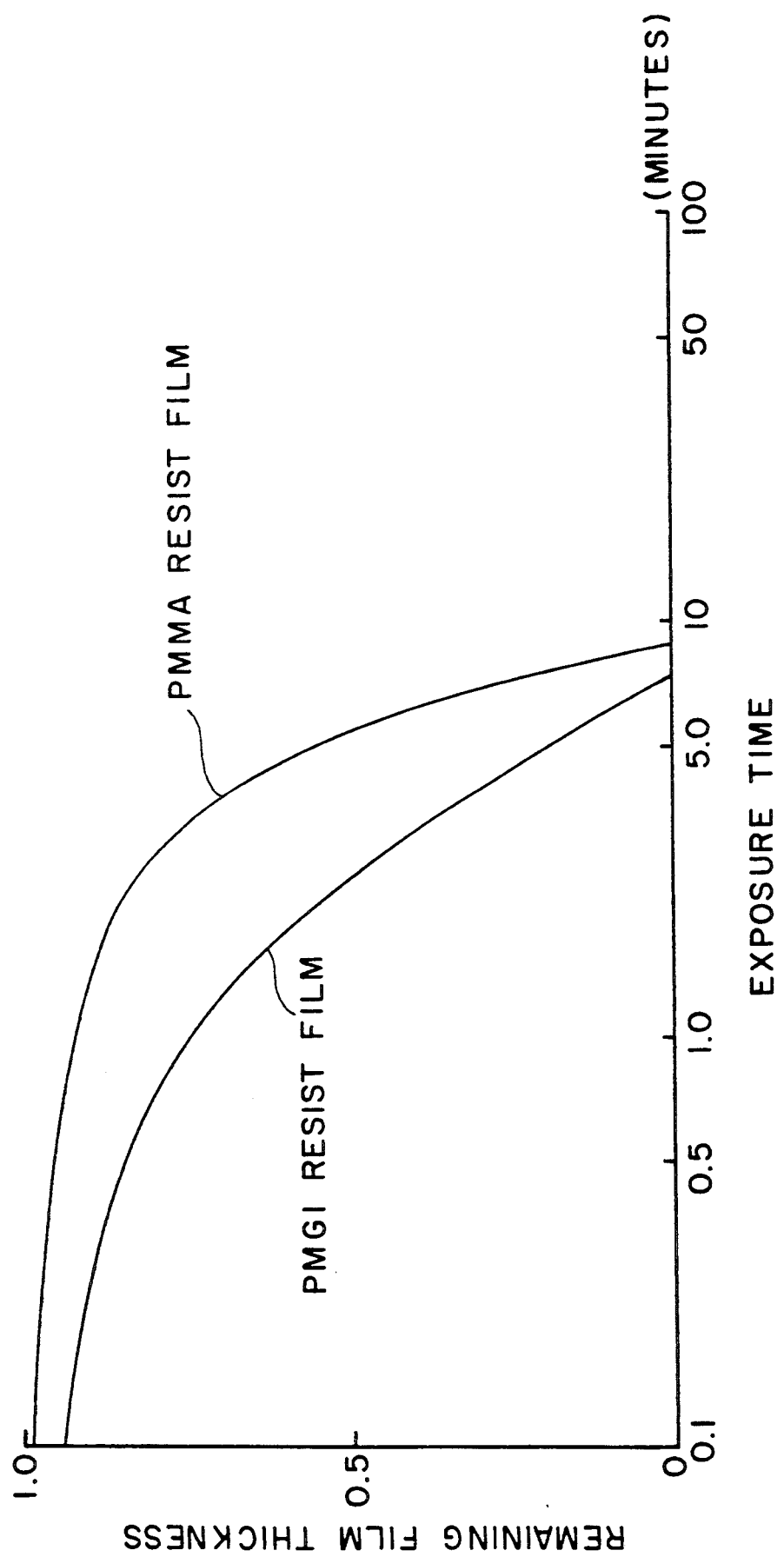

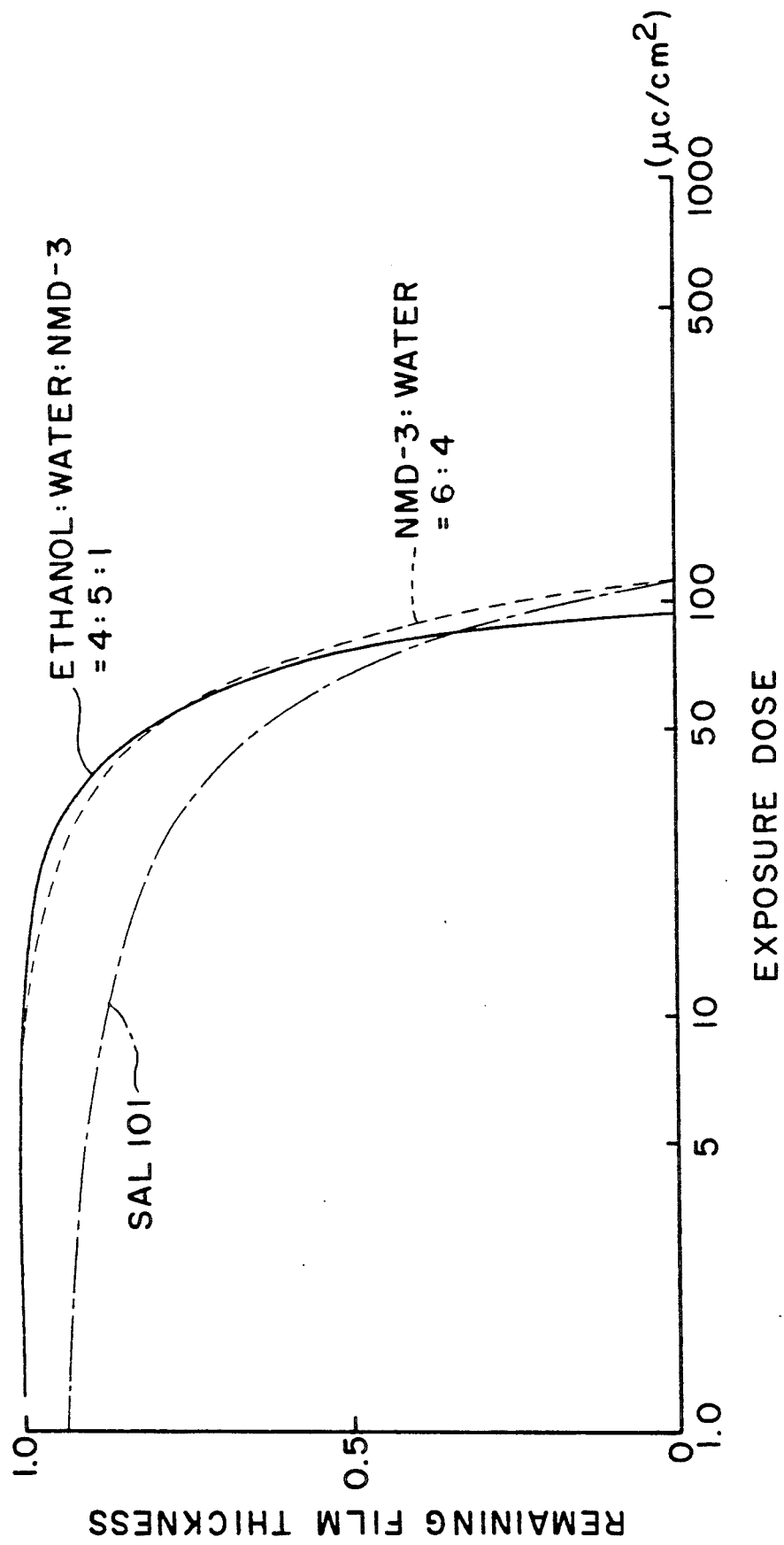

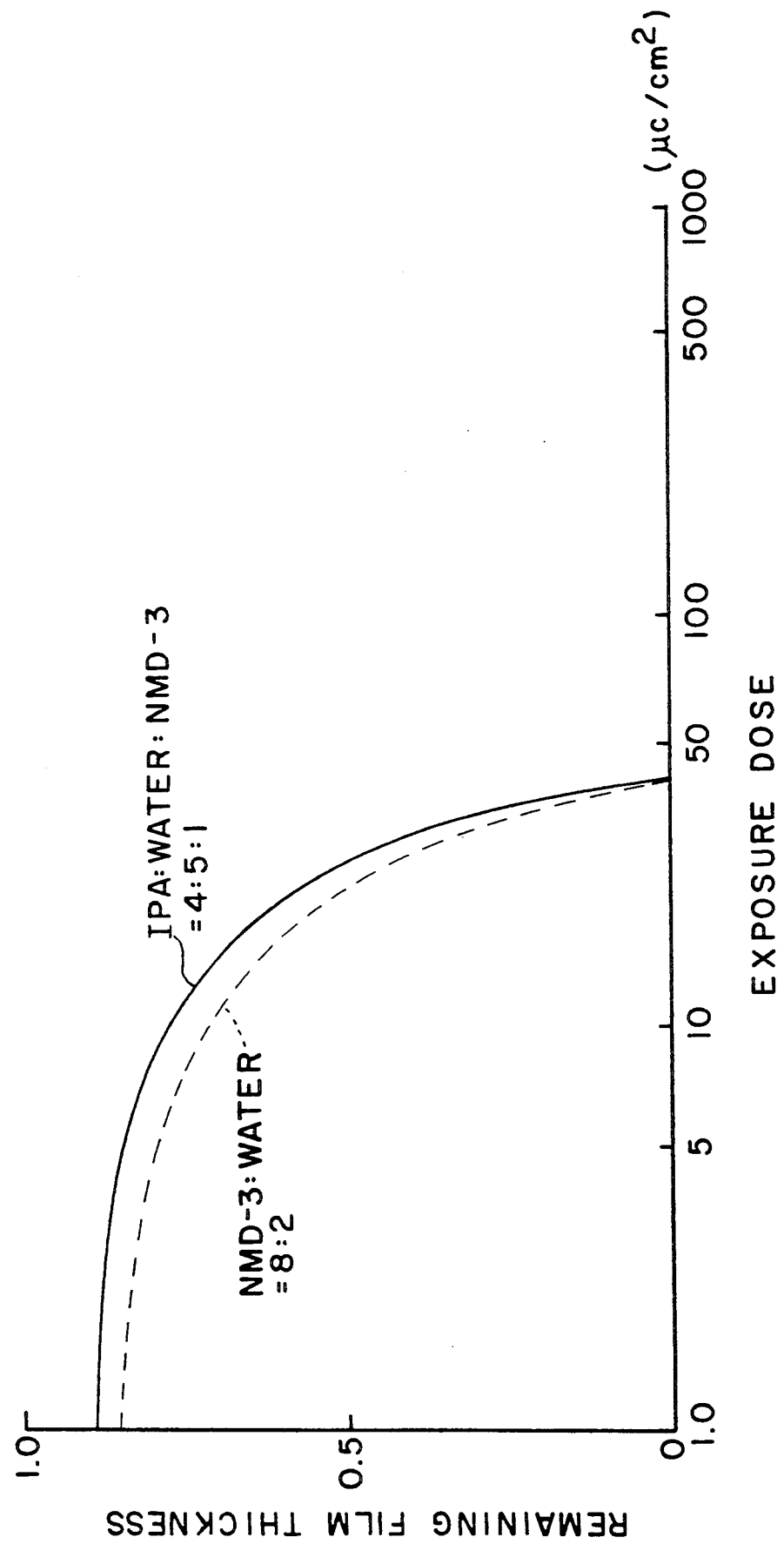

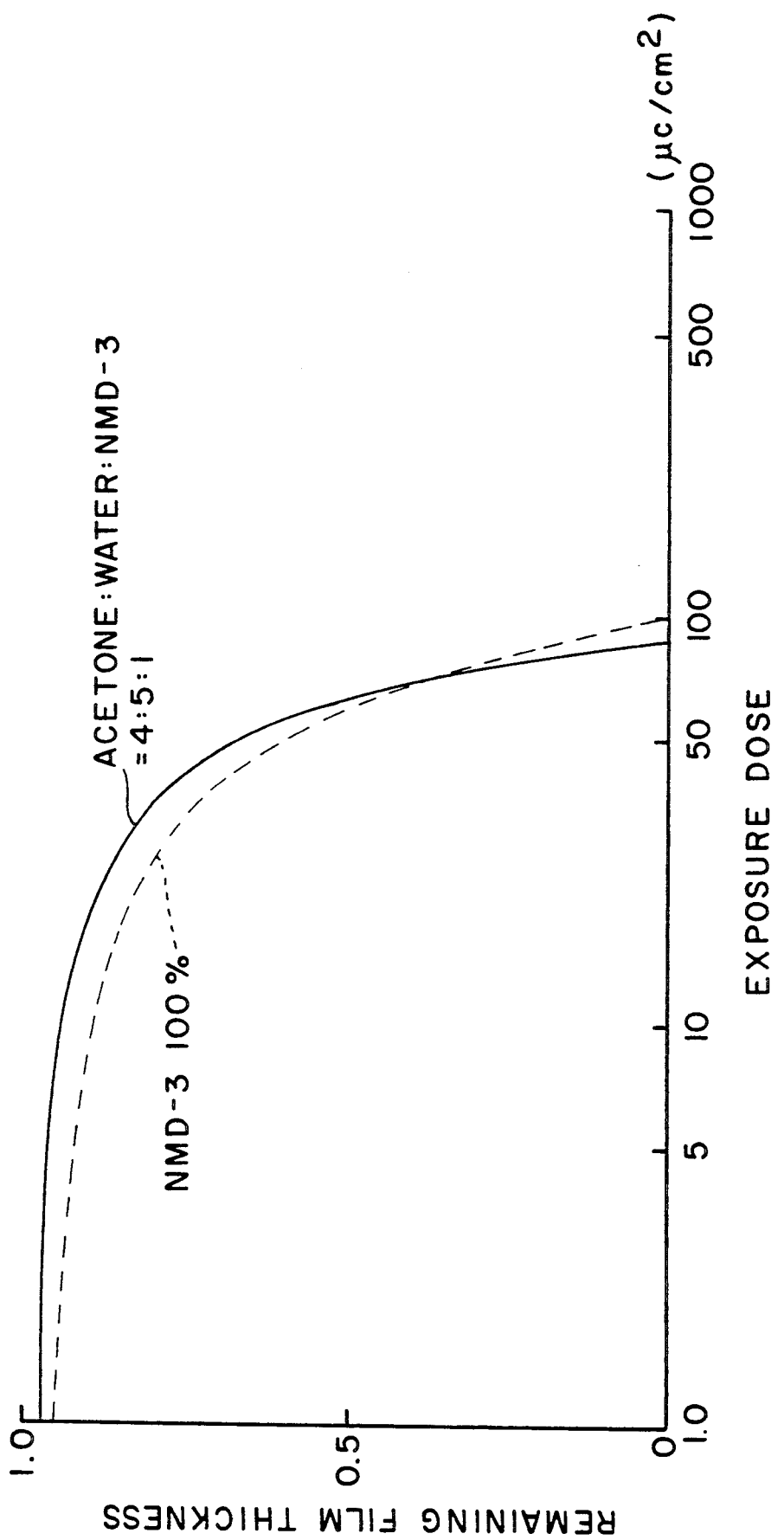

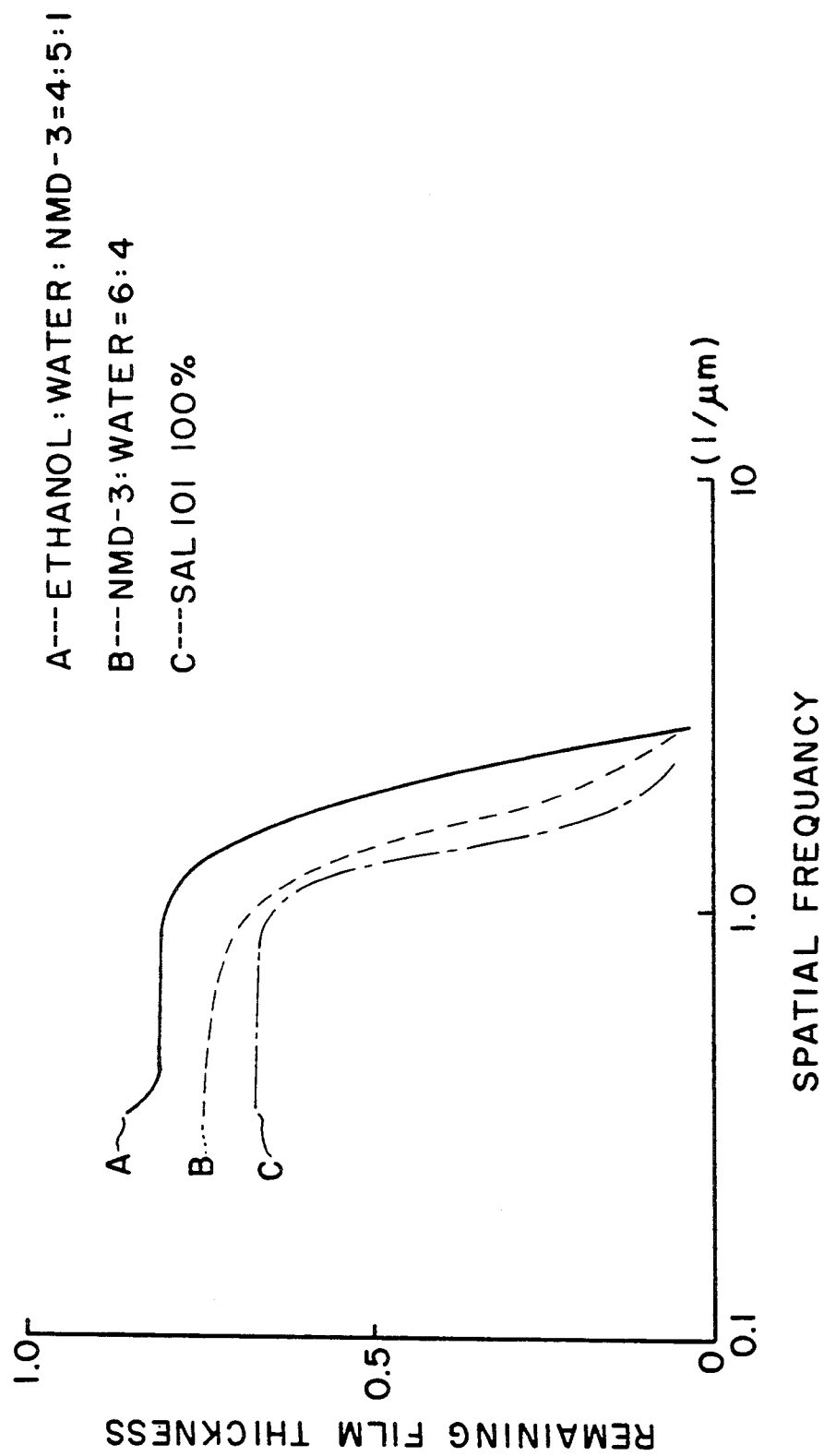

FIG. 10(e)
PRIOR ART
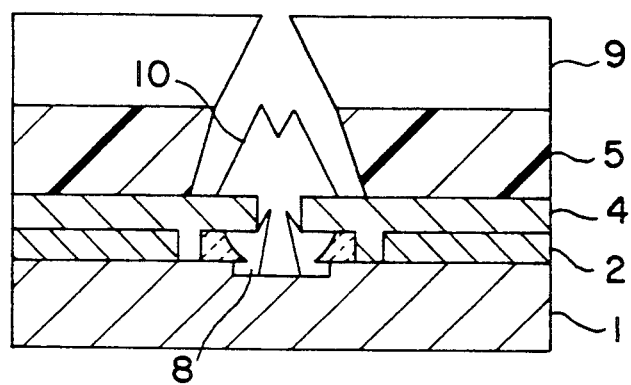
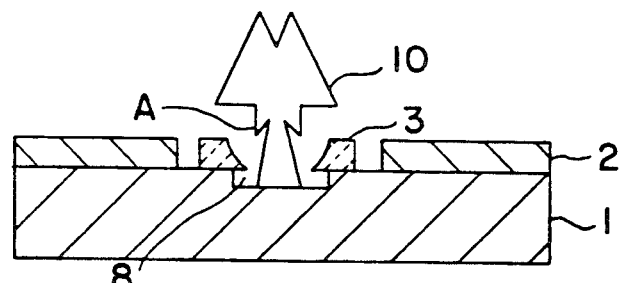
FIG. 10(f)
PRIOR ART

DEVELOPING SOLUTION AND PATTERN FORMING METHOD USING THE SAME

BACKGROUND OF THE INVENTION

The present invention relates to a developing solution and a pattern forming method using the same, for forming patterns on a semiconductor substrate surface or the like.

The development of high speed discrete device using a compound semiconductor has been promoted recently. In order to enhance the characteristics of such device and realize faster operation, it is necessary to narrow the width of the opening for forming the gate electrode. When the opening width becomes narrower, however, the gate electrode resistance increases, which is known to hinder the speed from increasing.

To solve this problem it has been conventionally known to use a T-shaped gate electrode as the gate electrode. The T-shaped gate electrode is so structured as to be narrower at the contact portion and wider in the upper portion of the electrode.

FIGS. 10(a) to (f) show a process sectional view for forming a conventional GaAs FET T-shaped gate electrode by employing the electron beam exposure and liftoff technology.

In FIG. 10(a), numeral 1 shows a GaAs substrate consisting of an epitaxial layer of GaAs, or GaAs and AlGaAs functioning active layer on semi-insulating GaAs. A source and drain electrodes 2 made of AuGe/Ni are formed on a GaAs substrate 1, and an $SiO_2$ spacer 3 is formed on the GaAs substrate 1. Next, on the source, drain electrodes 2, $SiO_2$ spacer 3 and GaAs substrate 1, a PMMA (polymethyl methacrylate) resist layer 4 with a mean molecular weight of 600,000 is applied, and is heated. In succession, on the PMMA resist film 4, a PMMA resist film 5 with a mean molecular weight of 200,000 is applied and is heated. Next, a specified portion is exposed by using a 50 kV electron beam 6.

Then, using MIBK (methyl isobutyl ketone), the PMMA resist films 4, 5 are developed, and a PMMA resist pattern 7 is formed (FIG. 10(b)).

In FIG. 10(c), using the PMMA resist pattern 7 as the mask, the $SiO_2$ spacer 3 is etched by a wet process so as to form an $SiO_2$ spacer pattern 3a.

In FIG. 10(d), using the $SiO_2$ spacer pattern 3a as the mask, the GaAs substrate 1 is etched in wet process by using a mixed aqueous solution of tartaric acid and hydrogen peroxide as an etchant, and a recess structure 8 is formed.

Consequently, an Al film 9 is evaporated on the surface of PMMA resist films 4, 5 and GaAs substrate 1, and an Al gate electrode, that is, a T-shaped gate electrode 10 is formed (FIG. 10(e)).

Further, dissolving and removing the PMMA resist films 4, 5 with organic solvent or the like, the unnecessary Al film 9 is lifted off, and the structure in FIG. 10(f) is obtained.

In order to obtain the T-shaped gate electrode 10, in FIG. 10, an example of using PMMA resist films 4, 5 is shown, but since the PMMA resist films 4, 5 are inferior in heat resistance and adhesion to the substrate, a process of using PMGI resist or the like has been developed in order to improve these points. In the process using the PMGI resist, an alkaline aqueous solution, or a mixed aqueous solution of alkali and salt is used as the developing solution. In this case, as the alkali, tetramethyl ammonium hydroxide is widely used. The salt acts as surfactant, and usually tetraalkyl ammonium salt is used.

In the prior art, however, when the PMGI resist is developed by an alkaline aqueous solution or a mixed aqueous solution of alkali and salt, the change of rate of dissolution to the change of exposure dose is slow, or the normalized remaining film thickness in the unexposed portion and the gamma value are small. Accordingly, it is difficult to form a pattern with a steep side wall. Even when a single layer of PMGI resist is used, it is difficult to form the pattern in a size of 0.4 μm or less. It is hence impossible to use it for forming T-shaped gate electrode in a fine pattern. Or when the concentration of the tetramethyl ammonium hydroxide is diluted before use, the remaining film thickness change due to the change of exposure dose becomes larger, that is, the gamma value becomes higher, but the sensitivity is lowered. Besides, as a result of dilution of tetramethyl ammonium hydroxide, the hydrophilic property is enhanced, and the wettability to the hydrophobic resist becomes poor. Accordingly, when developing the PMGI resist used as the lower layer of the two-layer resist, if the opening width of the upper layer resist pattern is narrow, the developing solution of the PMGI resist does not flow smoothly into the opening, and the PMGI resist can not be developed evenly. To avoid this, it is considered to enhance the wettability by mixing the developing solution with surfactants, but in this case, the gamma value becomes smaller, and the resolution is lowered.

In the process shown in FIG. 10, since the PMMA resist film 5 with the mean molecular weight of 200,000 in the upper layer and the PMMA resist layer 4 with the mean molecular weight of 600,000 in the lower layer are developed simultaneously, it is difficult to control and optimize the opening width of the upper resist and that of the lower resist at the same time. Still futher, since the adhesion of the PMMA resist film 4 to the GaAs substrate 1 is poor, it is necessary to place the $SiO_2$ spacer 3. If the adhesion is poor, the $SiO_2$ spacer 3 at the edge portion 7a (FIG. 10(b)) of the PMMA resist pattern 7 and the bottom of the PMMA resist film 4 are lifted, and therefore in the wet etching process of the pattern of the $SiO_2$ spacer 3, the etchant may reach as far as the bottom of the edge portion 7a of the PMMA resist pattern 7, and therefore the $SiO_2$ spacer pattern 3a may be wider than desired. Since the $SiO_2$ spacer 3 is isotropically etched in the wet etching process, the controllability of the opening width is poor, and the opening width tends to be wider than the opening width of the PMMA resist mask. Accordingly, the opening width of the recess structure 8 becomes broader. Besides, the distance between the bottom of the lower PMMA resist film 4 and the bottom of the recess structure 8 is extended by the portion of the thickness of the $SiO_2$ spacer 3, and the evaporated T-shaped gate electrode 10 is easily separated at the position indicated by part A in FIG. 10(f). That is, the width of the evaporated T-shaped gate electrode 10 is defined by the opening width of the lower PMMA resist film 4, and is deposited, but the Al is also evaporated on the side wall at the opening of the lower PMMA resist film 4, and the opening width of the lower PMMA resist film 4 becomes narrower as the evaporation time passes, and the evaporated deposit becomes triangular. Finally, the opening is plugged by the evaporation deposit collected at both side walls of the opening of the lower PMMA resist film 4, and if evaporation is further continued, Al is not evaporated at all in the gate area. That is, as compared with the opening width of the lower PMMA resist film 4, the distance from the substrate surface for depositing the evaporation deposit to the opening of the lower PMMA resist film 4 is longer, and in this state, when the T-shaped gate electrode 10 is deposited, it is formed like a mushroom from the part nearer to the upper end of the triangle, and the umbrella-shaped portion and the root of the stem of the mushroom are likely to be broken or peeled off when lifting off. It is therefore difficult to form the T-shaped gate electrode with a narrow gate length. If the $SiO_2$ spacer 3 is not installed, in the wet etching process of the GaAs substrate, the etchant may invade into the interface of the resist film and GaAs substrate, which may further extend the width of the recess structure.

SUMMARY OF THE INVENTION

It is hence a primary object of the invention to present a developing solution of PMGI resist film higher in resolution than in the prior art in order to solve the above problems.

It is a second object of the invention to present a stable pattern forming method of high performance and high reliability using such developing solution.

According to the invention, a polydimethyl glutarimide film is formed on a substrate, and is heated, and the polydimethyl glutarimide exposed in a specific area to electron beams, deep ultraviolet light, ion beams or X-rays is developed in a solution containing acetone, ethyl alcohol, or isopropyl alcohol, water and alkali.

The invention comprises a step of applying and baking polydimethyl glutarimide film on a substrate, a step of applying and baking a polymer film having a sensitivity to a charged particle beam such as an electron beam, ion beam, or short wavelength electromagnetic waves such as deep ultraviolet light or X-rays on the polydimethyl glutarimide film, a step of simultaneously exposing the polymer film and the polydimethyl glutarimide film by the charged particle beam or the short wavelength electromagnetic wave in a specified area of the two-layer film composed of the polydimethyl glutarimide film and the polymer film, a step of developing the specified area of the polymer film by using an organic solvent, and a step of developing the specified area of the polydimethyl glutarimide film by using a solution containing an alkali.

Furthermore, the invention comprises a step of applying and baking a polydimethyl glutarimide film on a substrate, a step of applying and baking a polymer film having a sensitivity to charged particle beam such as electron beam, ion beam, or short wavelength electromagnetic waves such as deep ultraviolet light or X-rays on the polydimethyl glutarimide film, a step of exposing simultaneously the polymer film and the polydimethyl glutarimide film by the charged particle beam or the short wavelength electro magnetic wave in the specified area of two-layer film composed of the polydimethyl glutarimide film and the polymer film, a step of developing the specified area of the polymer film by using an organic solvent, a step of developing the specified area of the polydimethyl glutarimide film by using a solution containing an alkali, a step of etching the substrate, a step of depositing a metal film on the entire surface of the substrate, and a step of removing the polymer film and the polydimethyl glutarimide film, wherein the remaining film portion of the polymer film after development is in an overhang shape, and the opening width of the polydimethyl glutarimide film is narrower than the opening width of the upper part of the polymer film after development.

The invention moreover comprises a step of applying and baking a polydimethyl glutarimide film on a substrate, a step of applying and baking a polymer film having a sensitivity to charged particle beam such as electron beam, ion beam, or short wavelength electromagnetic waves such as deep ultraviolet light or X-rays on the polydimethyl glutarimide film, a step of simultaneously exposing the polymer film and the polydimethyl glutarimide film by the charged particle beam or the short wavelength electromagnetic wave in a specified area of the polydimethyl glutarimide film and the polymer film, a step of developing the specified area of polymer film by using an organic solvent, a step of developing the specified area of the polydimethyl glutarimide film by using a solution containing an alkali, a step of etching the substrate, a step of depositing a metal film on the entire surface of the substrate, and a step of removing the polymer film and the polydimethyl glutarimide film, wherein a remaining film portion of the polymer film after development is trapezoidal, and the pattern width of the remaining film portion of the polydimethyl glutarimide film after development is narrower than the pattern width of the bottom of the trapezoidal shape of the polymer film after development.

According to the invention, the sensitivity of the PMGI resist to an alkaline aqueous solution and the gamma value depend on the alkali concentration, and the sensitivity is higher and the gamma values is lower as the concentration is higher. Besides, the sensitivity or gamma value of the PMGI resist to a mixed solution of acetone, ethanol, or isopropyl alcohol and, water and alkali depends on the type of organic solvent and the mixing rate of components. However, when comparing an alkaline aqueous solution with a mixed solution of acetone, ethanol, or isopropyl alcohol, water and alkali, by which a PMGI resist film developed at the same sensitivity at the same development time as in the development by the alkaline aqueous solution, the normalized remaining film thickness of the unexposed part and the gamma value are larger in the mixed solution. Accordingly, by using the PMGI resist, a finer pattern than before may be formed.

Still further, by forming a two-layer film structure employing the PMGI resist in the lower layer and the polymer film possessing sensitivity to electron beam in the upper layer, on the substrate, after exposing them, the upper layer is developed by an organic solvent and the lower layer is developed by a mixed solution containing an alkali. In this process, since the development of upper resist and lower resist may be controlled independently, a pattern having a specific sectional shape may be easily formed.

Furthermore, prior to liftoff, if there is a step of etching the substrate in wet process, since the adhesion of the PMGI resist to the substrate is excellent, the etching width in the lateral direction is prevented from becoming excessive.

Besides, when a mixed solution of acetone, ethanol, or isopropyl alcohol, and water and alkali is used in the development of lower PMGI resist, the wettability to the upper resist is better than in the alkaline aqueous solution, and the mixed solution easily gets into the opening of the upper resist pattern, so that the development of the lower PMGI resist is stabilized.

BRIEF DESCRIPTION OF THE DRAWINGS

FIG. 6 shows 25 kV electron beam sensitivity curve diagrams of PMMA film developed in MIBK for 180 seconds, and PMGI film developed in SAL101 for 180 seconds;

FIG. 7 is a sensitivity diagram of PMGI resist film and PMMA resist film to far ultraviolet rays of wavelength of 250 nm;

FIG. 8(a) shows 25 kV electron beam sensitivity curve diagrams of PMGI film when developed for 180 seconds in a mixture of ethanol, water and NMD-3 at the ratio by volume of 4:5:1, in an alkaline aqueous solution of diluted NMD-3 in water at 6:4, and in SAL101 (100%);

FIG. 8(b) shows 25 kV electron beam sensitivity curve diagrams of PMGI film when developed for 180 seconds in a mixture of iso-propyl alcohol, water and NMD-3 at the ratio by volume of 4:5:1, and in an alkaline aqueous solution of diluted NMD-3 in water at 8:2;

FIG. 8(c) shows 25 kV electron beam sensitivity curve diagrams of PMGI film when developed for 30 seconds in a mixture of acetone, water and NMD-3 at the ratio by volume of 4:5:1, and in NMD-3 (100%);

FIG. 9 shows the relation between the normalized remaining film thickness and the spatial frequency at the center of the line, when forming a line-and-space pattern at the 1:1 ratio of line width and space width on a PMGI resist film, by using, as developing solutions, a mixed solution of ethanol, water and NMD-3 at 4:5:1, an alkaline aqueous solution of diluted NMD-3 in water at 6:4, and SAL101 (100%); and FIGS. 10(a), 10(b), 10(c), 10(d), 10(e) and 10(f) are process sectional views for forming a T-shaped gate electrode of GaAs FET using the conventional electron beam exposure and liftoff technology.

DETAILED DESCRIPTION OF THE INVENTION

Figure 1A:
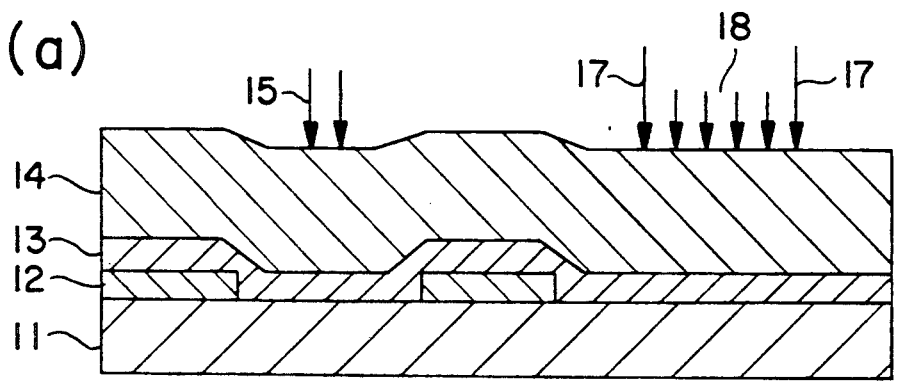
FIGS. 1(a), 1(b), 1(c), 1(d), 1(e) and 1(f) are process sectional views of a first embodiment of the invention for forming a T-shaped aluminum gate electrode.

FIGS. 1(a) to (f) show the process sectional views in a first embodiment of the invention forming a T-shaped aluminum (hereinafter Al) gate electrode to describe the invention in detail.

A source and drain electrodes 12 made of AuGe/Ni are formed on a GaAs substrate 11 forming an epitaxial layer made of GaAs or GaAs and AlGaAs functioning as an active layer on a semi-insulating GaAs substrate. A PMGI (polydimethyl glutarimide) resist film 13 is applied, in a film thickness of 0.10 to 0.20 μm, on the GaAs substrate 11 on which the source and drain electrodes 12 are formed, and are prebaked. As the PMGI resist film 13, the SAL-110 PL1 of Shipley was used by diluting in cyclopentanone. By this diluting, a thin PMGI resist film 13 could be formed. The prebaking time was 30 minutes at 270° C. in a nitrogen atmosphere by using a constant temperature drying oven.

Afterwards, cooling the GaAs substrate to 23° C., a PMMA (polymethyl methacrylate) resist film 14 was applied, in a film thickness of 0.9 μm on the PMGI resist film 13, and was prebaked. As the PMMA resist 14, OEBR-1000 of Tokyo Oka Kogyo was used. The prebaking time was 20 minutes at 170° C. in a nitrogen atmosphere by using a constant temperature drying oven.

Here, to composed a two-layer resist structure, the prebaking temperature of the upper resist must be lower than that of the lower resist. If the prebaking temperature of the upper resist is higher, when the upper resist is prebaked, the lower resist is hardened, and it is no longer developed, or the exposure sensitivity is changed.

After forming the two-layer resist film, the gate pattern of 0.1 μm width is exposed by a 50 kV electron beam 15. The electron beam diameter is about 0.1 μm, and the exposure dose is 600 to 900 μC/cm$^2$. Here, at the pattern width of 0.5 μm or less, such as in the gate pattern, the higher the acceleration voltage, the smaller becomes the angle of scattering in the resist, that is, the forward scattering in the resist is smaller, so that a finer pattern may be formed.

Where it is not necessary to form a fine pattern, as in the case of gate pad pattern of a wide area (for example, 50 μm square), the throughput is raised by drawing at a low acceleration voltage to raise the exposure sensitivity. Besides, when the acceleration voltage is lower, the forward scattering is wider and the spread of the back scattering electrons is small, so that an overhang shape may be formed easily. However, if the acceleration voltage is extremely low, the electrons remain within the resist, and an unexposed area is left over in the resist.

Considering these points, the exposure was conducted by using an electron beam 16 of acceleration voltage of 25 kV and beam diameter of about 1.0 μm, at the area exposure dose of 50 to 60 μC/cm$^2$. Besides, in order to shape the PMMA resist pattern edge of the gate pad pattern part into an overhang form (broader in the opening width of the resist bottom than the opening width of the resist upper surface) so as to be more suited to liftoff, the periphery of the gate pad pattern was margined and exposed at a line exposure dose of 5 to 15 nC/cm with an electron beam 17 with an acceleration voltage of 25 kV and beam diameter of about 1.0 μm. The electron beam 17 exposed the area of 0.5 to 1.5 μm outside of the electron beam 16.

Figure 2:
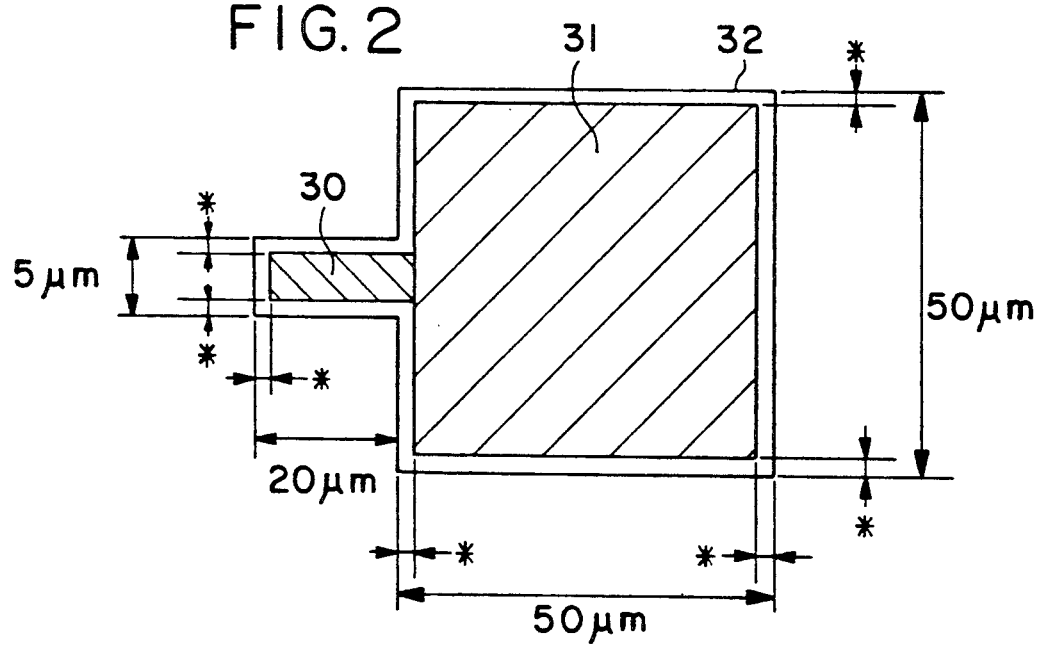
FIG. 2 is a design example drawing for depicting a gate pad pattern.

About this exposure method, a design example of drawing a gate pad pattern is shown in FIG. 2. In FIG. 2, numerals 30, 31 denote the area exposure patterns, in which the area exposure dose are respectively 60 and 50 μC/cm$^2$. Numeral 32 is a margin exposure pattern, in which the line exposure dose is 10 nC/cm. The interval indicated by the asterisk (*) is 1.0 μm.

Summing up, the GaAs substrate 11, the upper layers of PMMA resist patterns 14a, 14b are shaped in an overhang form, and the fine pattern 13a of the PMGI in the gate area is formed with high precision by employing the method of (a) exposing the large pattern width area at low acceleration voltage, in small exposure dose, while margining in a large exposure dose, and (b) exposing the small pattern width area at high acceleration voltage, in large exposure dose (FIG. 1(a)).

Figure 1B:
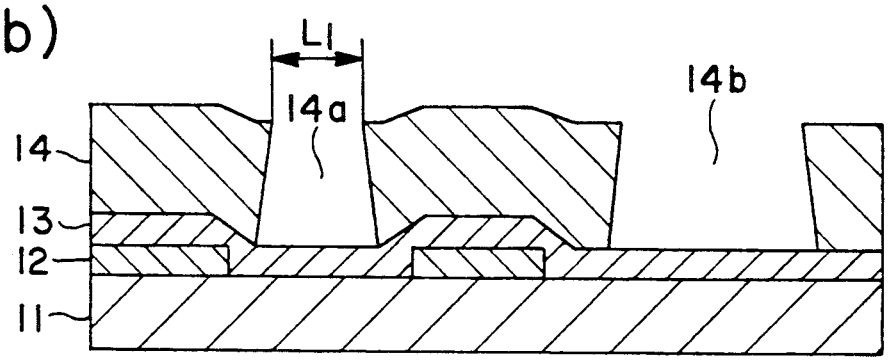

In consequence, the upper PMMA resist film 14 is developed by using MIBK (methyl isobutyl ketone), and PMMA resist patterns 14a, 14b are formed as shown in FIG. 1(b). The development was dip development for 10 to 15 minutes. The solution temperature was 23° C. At this time, the sensitivity of the PMMA resist 14 is 20 to 24 $\mu C/cm^2$. The PMMA resist patterns 14a, 14b are formed in overhang. At this time, the opening width $L_1$ of the PMMA resist 14a in the gate pattern area is 0.45 to 0.55 $\mu m$. When developing the PMMA resist film 14, however, the PMGI resist film 13 is not dissolved in the developer MIBK of the PMMA resist 14.

Figure 1C:
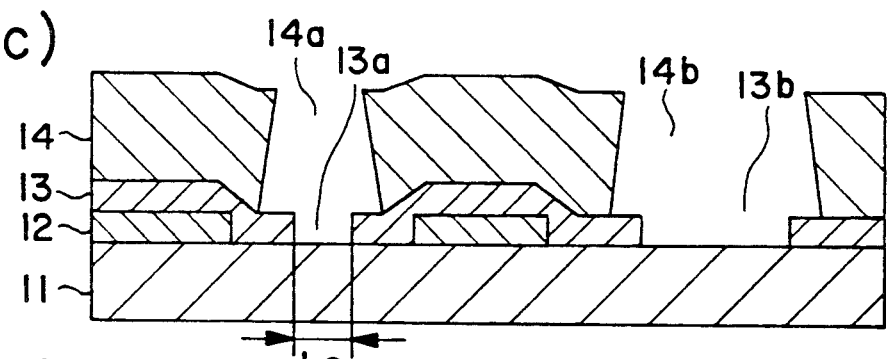

In FIG. 1(c), the lower PMGI resist film 13 is developed in a mixed solution of ethanol, water and NMD-3 at 4:5:1, and PMGI resist patterns 13a, 13b are obtained. The developing time is 30 to 75 seconds, and the opening width $L_2$ of the gate pattern part 13a is 0.15 to 0.25 $\mu m$. When developing the PMGI resist, the PMMA resist film 14 is not dissolved in this mixed solution. Therefore, the shape of the PMMA resist patterns 14a, 14b is not changed at the time of development of the PMGI resist 13.

Thus, the shape of the upper PMMA resist patterns 14a, 14b and the lower PMGI resist patterns 13a, 13b can be controlled independently.

Figure 1D:
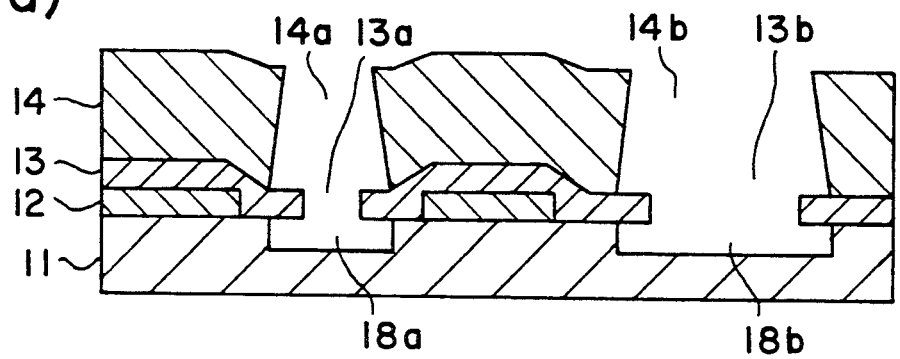

In FIG. 1(d), in an aqueous solution containing tartaric acid and hydrogen peroxide, the GaAs substrate is etched in wet process, and recess structures 18a, 18b are formed.

Figure 1E:
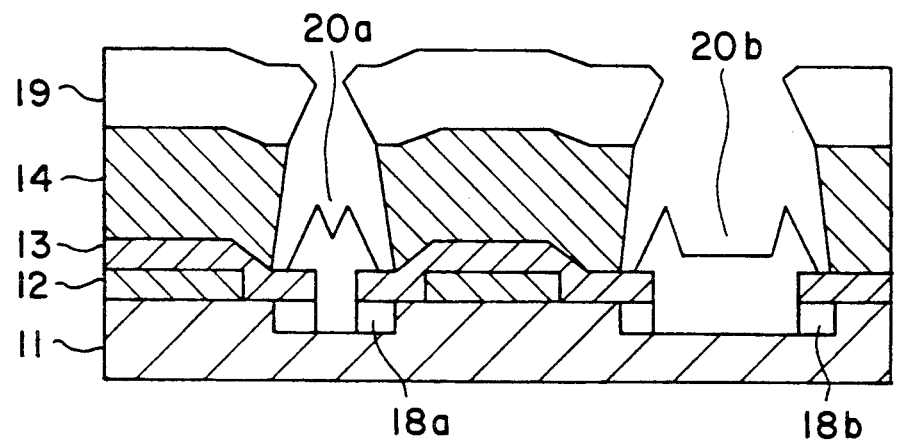

In FIG. 1(e), on the GaAs substrate 11 having the structure as shown in FIG. 1(d), an Al film 19 is evaporated in a thickness of 0.5 to 0.6 $\mu m$, and Al gate electrodes 20a, 20b are obtained. The opening width of the PMMA resist pattern 14a is wider than the opening width of the PMGI resist pattern 13a, and the Al gate electrode 20a becomes a T shape. The gate pad part 20b is the same.

Figure 1F:
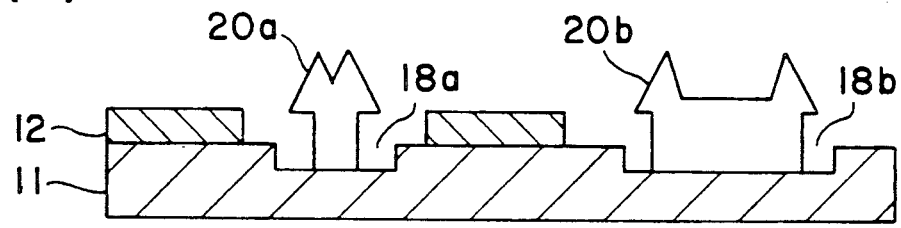

Furthermore, using acetone and resist parting agent J-100 of Nagase, the PMMA resist film 14 and PMGI resist film 13 are dissolved, and the undesired portion of the Al film 19 is removed by liftoff, and the liftoff process is completed (FIG. 1(f)).

Figure 3:
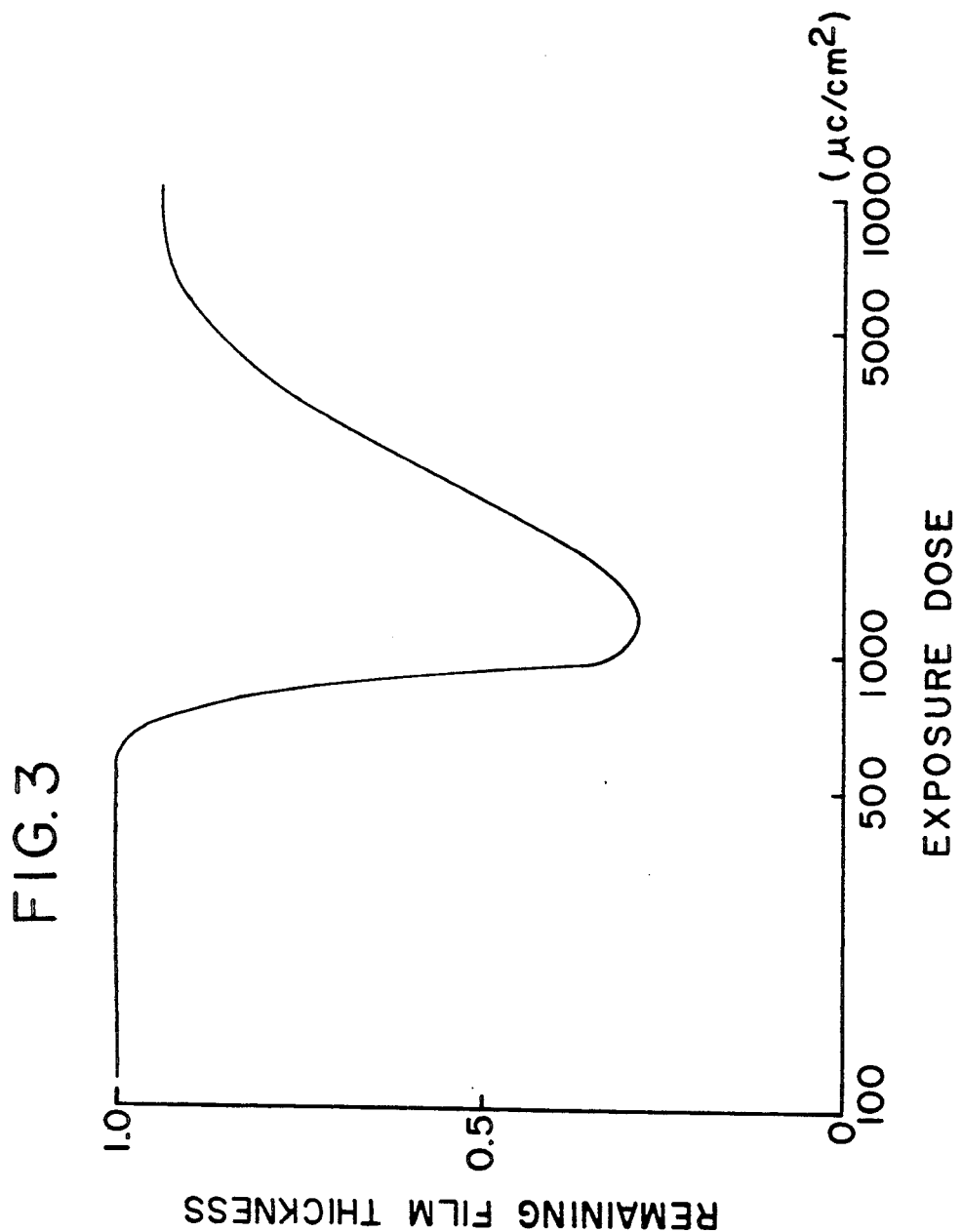
FIG. 3 is a 25 kV electron beam sensitivity curve diagram of PMGI film when developed in MIBK.

When developing the PMMA resist 14, the result of confirming that the PMGI resist 13 is not dissolved in the PMMA resist developer is shown in FIG. 3.

FIG. 3 is a 25 kV electron beam sensitivity curve developed in the MIBK of the PMGI resist. The resist sensitivity was determined by measuring the remaining film thickness after development by exposing a rectangular pattern of 50 $\mu m \times 100$ $\mu m$ by varying the exposure dose.

The initial film thickness of the PMGI resist was 0.85 $\mu m$, the developing time was 180 seconds, and the solution temperature was 23° C. It is known from this result that the PMGI resist is not dissolved at all in the MIBK at an exposure dose of 500 $\mu C/cm^2$ or less.

When the pattern of 0.1 $\mu m$ in width is exposed at an acceleration voltage of 50 kV at a dose of 600 to 900 $\mu C/cm^2$, the energy absorption density in the middle part of the pattern as converted into the exposure dose of the sensitivity measurement pattern at the acceleration voltage of 25 kV is about 45 to 70 $\mu C/cm^2$. That is, since the absorption energy of the lower PMGI resist film 13 is sufficiently small, it is understood that the PMGI resist film 13 is not dissolved at all in the MIBK.

It is the same for the PMGI resist film 13 in the gate pad pattern part.

Figure 4:
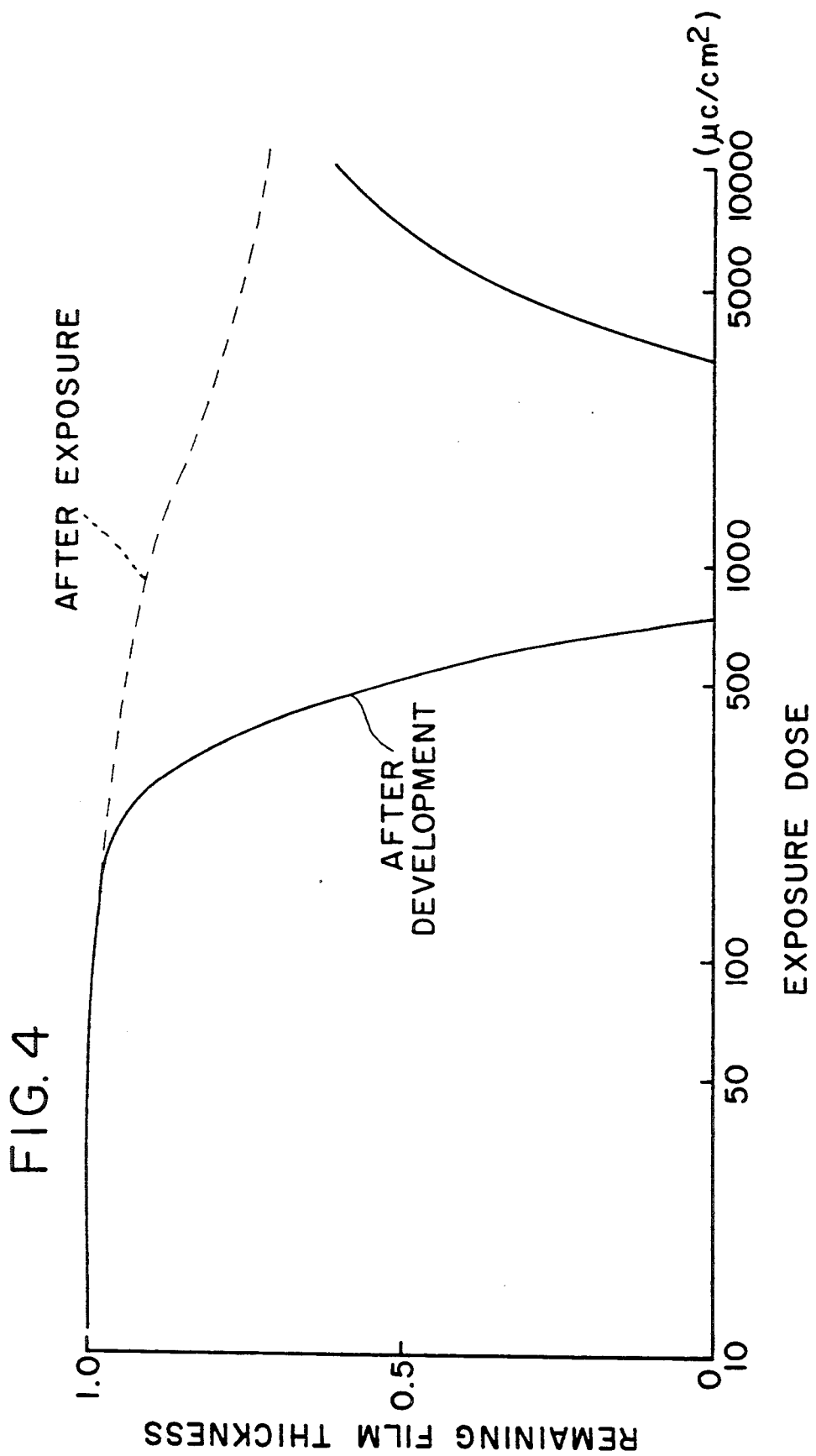
FIG. 4 is a 25 kV electron beam sensitivity curve diagram of PMMA film when developed in a mixture of ethanol, water and NMD-3 at the volume ratio 4:5:1.

Similarly, the result of confirming that the PMMA resist 14 is not developed in a developing solution for developing the PMGI resist 13 is shown in FIG. 4.

FIG. 4 shows the electron beam sensitivity curve at the acceleration voltage of 25 kV when developing the PMMA resist film 14 in a mixed solution of ethanol, water and NMD-3 at the volume ratio of 4:5:1. The initial film thickness of PMMA resist film is 0.85 $\mu m$, the developing time is 180 seconds, and the solution temperature is 23° C. The solid line denotes the normalized remaining film thickness after development. Since the PMMA resist film is reduced in thickness by the ablation of the removal of the resist surface exposed to electron beam at the time of exposure with electron beam, the normalized remaining film thickness after exposure is shown as indicated by a broken line.

It is understood from FIG. 4 that the PMMA resist film is not dissolved in the mixed solution described above at the exposure quantity of 150 $\mu C/cm^2$ or less.

The PMMA resist film 14 is removed in the portion of the absorption energy of 20 to 24 $\mu C/cm^2$, as converted into the exposure dose of the sensitivity measurement pattern, by the development in MIBK.

Accordingly, the shape of the PMMA resist patterns 14a, 14b is not changed when developing the PMGI resist 13.

Therefore, the shape of the upper PMMA resist patterns 14a, 14b and the lower PMGI resist patterns 13a, 13b can be controlled independently.

In this embodiment, since the PMGI resist is high in adhesion to the GaAs substrate 11, it is not necessary to install $SiO_2$ spacer on the GaAs substrate. Accordingly, when etching the substrate, the etching width is not broadened in the lateral direction, and the liftoff is carried out only by the height of the resist, the mushroom shape of the Al gate electrode is formed stably and in a highly reliable pattern.

Meanwhile in the embodiment shown in FIG. 1, it may be possible to expose the gate electrode pad pattern by using deep ultraviolet light instead of the electron beam 16 and margin with electron beam 17. In this case, the area of the electron beam exposure is reduced, and the through-put is enhanced.

Besides, after exposure of the gate pattern by electron beam 15, a pattern larger than the pattern width of the gate pattern 13a of the PMGI resist film 13 may be exposed over the gate pattern 13a in an exposure dose capable of developing only the PMMA resist film 14. In this case, the width of the upper part of the Al gate electrode 20a after liftoff becomes large, and the gate resistance may be decreased, so that it is advantageous for enhancing the device characteristics, in particular, the low noise performance.

In particular, when exposed by using an electron beam at an acceleration voltage of 30 kV or less, it brings about a benefit of widening the opening width of the PMMA resist pattern 14a easily while keeping the overhang shape of the section of the PMMA resist pattern 14a.

In a two-layer structure of the PMMA resist film 14, the PMMA resist film with a larger mean molecular weight may be used as the upper layer, and one with a smaller mean molecular weight as the lower layer. In this case, in a large area pattern of electrode pad or the like, without margin exposure, the sectional shape of the PMMA resist pattern 14b may be formed in an overhang.

Or, in a two-layer structure of the PMMA resist film 14, the PMMA resist film with a smaller mean molecular weight may be used as the upper layer and one with a larger mean molecular weight as the lower layer. At this time, the opening widths of the layers after development may be controlled in the relation of upper PMMA resist > lower PMMA resist > PMGI resist so that the mean distance between the Al gate electrode and GaAs substrate after liftoff may be increased, and the electrostatic capacity between the Al gate electrode and source electrode becomes smaller, which is advantageous for enhancing the device characteristics, in particular, the low noise performance.

FIGS. 5(a) to (f) show a second embodiment of the invention for forming Al gate electrode by employing the hybrid exposure method of electron beam and deep ultraviolet light.

Figure 5A:
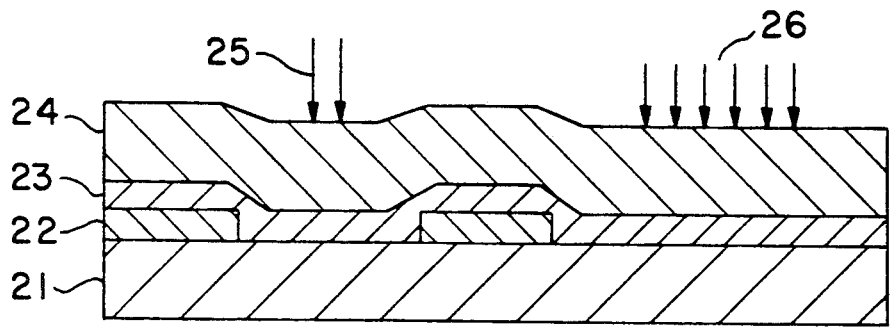
FIGS. 5(a), 5(b), 5(c), 5(d), 5(e) and 5(f) are process sectional views of a second embodiment of the invention for forming an Al gate electrode by using a hybrid exposure method of electron beams and far ultraviolet rays.

In FIG. 5(a), a source, drain electrode 22 is formed on a GaAs substrate 21 on which is formed an epitaxial layer composed of GaAs or GaAs and AlGaAs functioning as an active layer on a semi-insulating GaAs, and a PMGI resist film 23 is applied thereon in a thickness of 0.1 to 0.2 $\mu$m, and is heated. Afterwards, a PMMA resist film 24 is applied on the surface of the PMGI resist film 23 in a thickness of 0.3 to 0.5 $\mu$m, and a two-layer resist film is formed. By an electron beam 25 at the acceleration voltage of 25 kV, a gate pattern of 0.2 $\mu$m in width is exposed. The beam diameter is about 0.2 $\mu$m, and the exposure dose is 70 to 120 $\mu$C/cm$^2$. The gate pad of a large area is exposed by a deep ultraviolet light 26. For example, the deep ultraviolet light exposure is carried out for 5 to 10 minutes by a contact exposure method using a 500 W Xe-Hg lamp and a 250 nm cold mirror. Since the transmittance of the PMMA resist film 24 to the deep ultraviolet light 26 at the wavelength of 250 nm is large, more than 80%, the upper PMMA resist layer 24 and lower PMGI resist layer 23 are exposed at the same time.

Figure 5B:
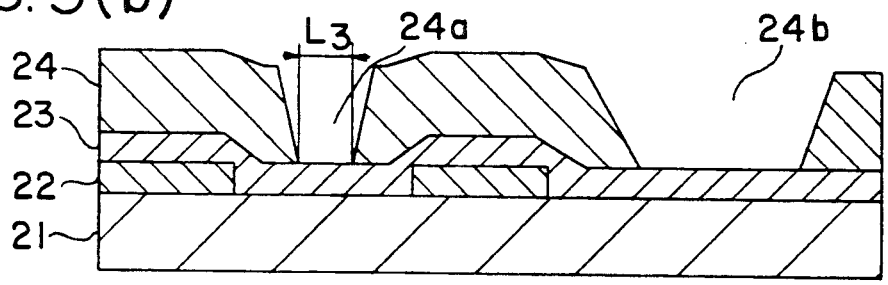

In FIG. 5(b), the upper PMMA resist film 24 is developed in MIBK, and PMMA resist patterns 24a, 24b are obtained. The developing time is 240 to 300 seconds, and the opening width $L_3$ of the PMMA resist pattern 24a at the gate pattern part is 0.2 to 0.5 $\mu$m.

As shown in FIG. 2, at the exposure dose used in ordering pattern forming, the lower PGMI resist film 23 is not dissolved in MIBK at all. It is same in the case of this deep ultraviolet light exposure.

Figure 5C:
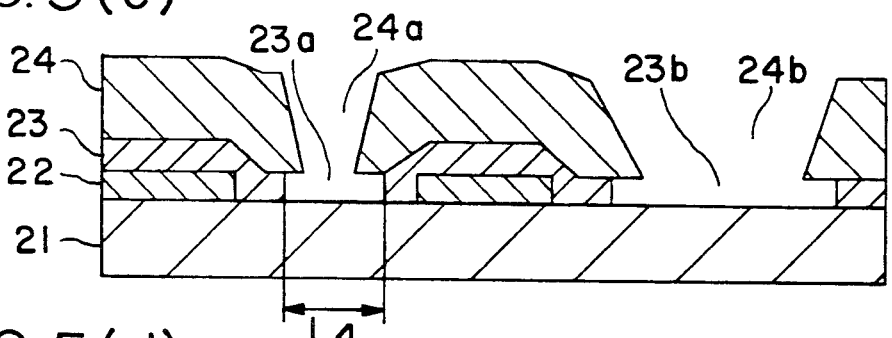

In FIG. 5(c), lower PMGI resist film 23 is developed in an organic alkaline developing solution SAL101 prepared by Shipley. The SAL101 is a mixed aqueous solution of organic alkali and surfactants. In this embodiment, which refers to a case of forming a gate electrode of an ordinary shape by liftoff, the opening width $L_4$ of the PMGI resist pattern 23a is larger than the opening width $L_3$ of the PMMA resist pattern 24a, and the PMGI resist pattern does not require high resolution. Accordingly, it is not necessary to use an alkaline solution mixing with organic solvent in the development of the PMGI resist film 23 as required in the first embodiment.

That is, by varying the type of developing solution depending on the purpose of forming pattern, a desired pattern may be formed.

Although the SAL101 is an aqueous solution, since it is blended with surfactants, its wettability to the PMMA resist film 24 is relatively favorable, so that it may smoothly invade the inner parts of the PMMA resist pattern 24a.

FIG. 6 shows an electron beam sensitivity at the acceleration voltage of 25 kV by developing the PMMA resist film in an initial film thickness of 0.85 $\mu$m in MIBK for 180 seconds, and an electron beam sensitivity to SAL101 of PMGI resist film shown by way of comparison. As evident from FIG. 6, the PMMA resist film and PMGI resist film possess a similar sensitivity to electron beams.

FIG. 7 shows the sensitivity of PMGI resist film and PMMA resist film to deep ultraviolet light 33 of wavelength of 250 nm. For exposure, a 500 W Xe-Hg lamp and a 250 nm cold mirror were used. The axis of abscissas denotes the exposure time (minutes). The initial film thickness was 0.85 $\mu$m in both PMMA resist film and PMGI resist film. The PMMA resist film was developed in MIBK, and the PMGI resist film in SAL101. The developing time was 180 seconds and the solution temperature was 23° C. in both cases. It is known from FIG. 7 that the PMMA resist film and PMGI resist film also possess similar sensitivity to deep ultraviolet light.

As clear from FIG. 6 and FIG. 7, since the PMMA resist film 24 and PMGI resist film 23 are similar in both sensitivity to electron beam and sensitivity to deep ultraviolet light, both of electron beam exposed portion and far ultraviolet ray exposed portion may be shaped into an overhang form composed of PMMA film and PMGI film, by optimizing the developing time of the lower PMGI resist film 23.

Furthermore, since the PMMA resist film 24 is not dissolved in the alkaline aqueous solution at any exposure quantity, the opening width of the upper PMMA resist patterns 24a, 24b and lower PMGI resist patterns 23a, 23b may be completely controlled independently. The opening width $L_4$ of the PMGI resist pattern 23a is 0.4 to 0.7 $\mu$m when developed for 100 to 150 seconds.

Figure 10A:
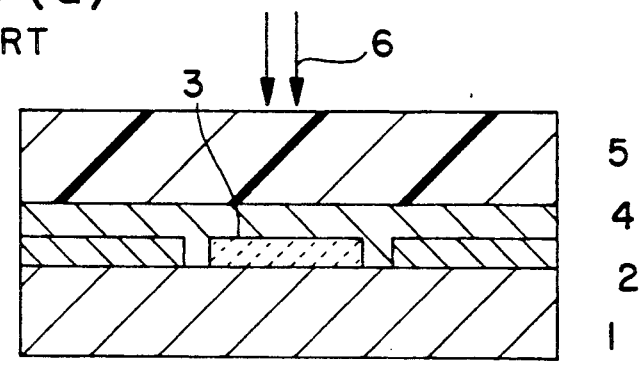
Figure 10B:
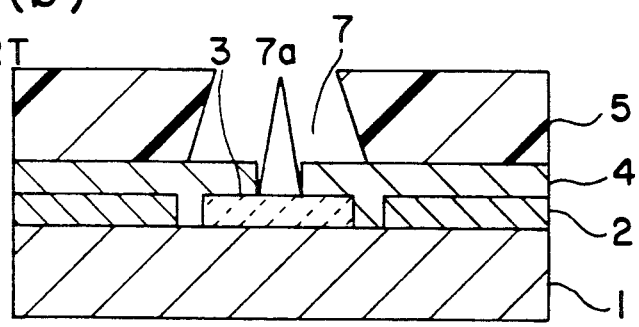
Figure 10C:
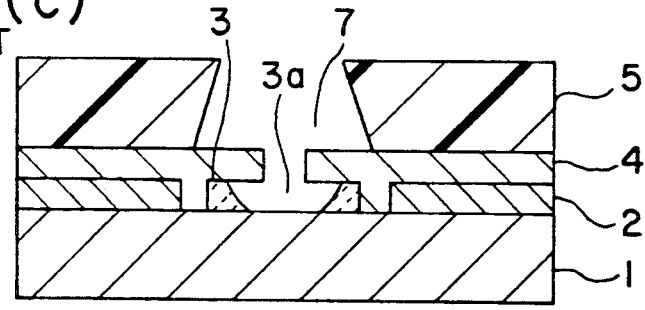
Figure 10D:
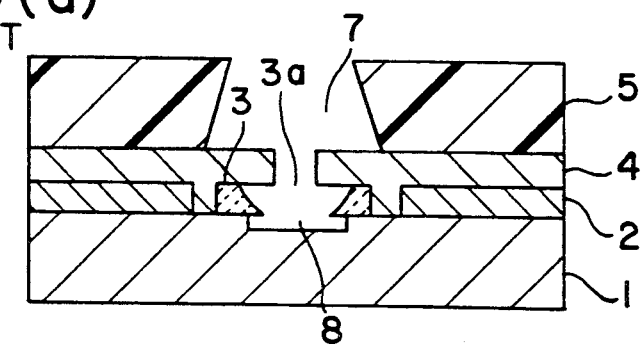

In the prior art shown in FIG. 10(c), since the SiO$_2$ spacer is etched isotropically, the dimensional controllability is poor, but by using the PMGI resist film 23, since the rate of dissolution of the exposed portion and unexposed portion changes steeply, only the exposed portion is developed, and the dimensional controllability is improved.

Figure 5D:
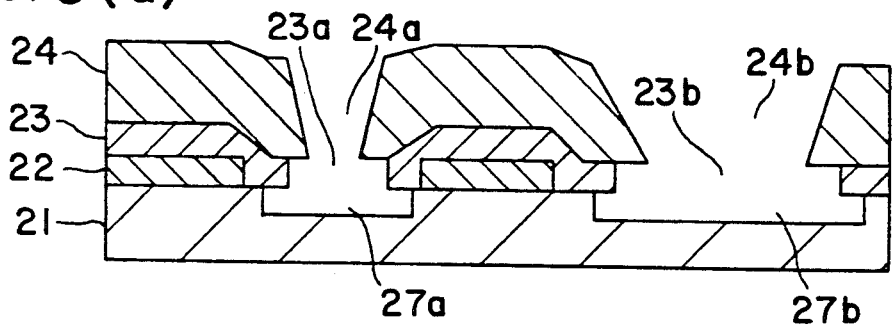

Next, in FIG. 5(d), the GaAs substrate 21 is etched by a wet process in an aqueous solution of tartaric acid and hydrogen peroxide, and recess structures 27a, 27b are obtained. Since the PMGI resist film 23 has a high adhesion to the GaAs substrate 21, excessive side etching does not occur.

Figure 5E:
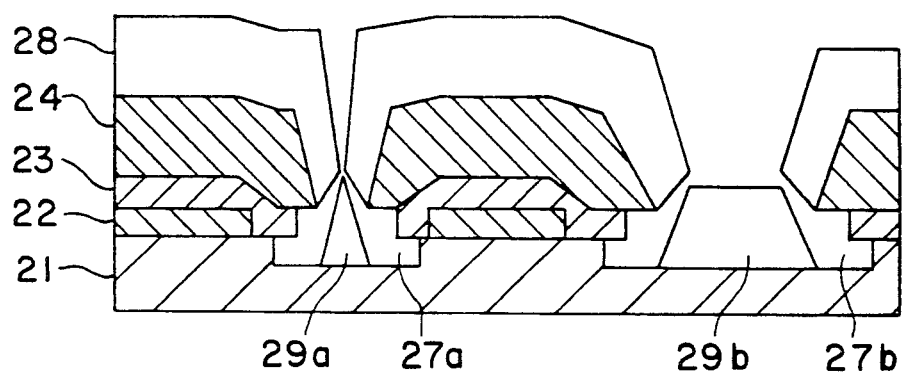

In FIG. 5(e), an Al film 28 is evaporated on the surface of the GaAs substrate 21 having a structure as shown in FIG. 5(d), and Al gate electrodes 29a, 29b are formed.

Figure 5F:
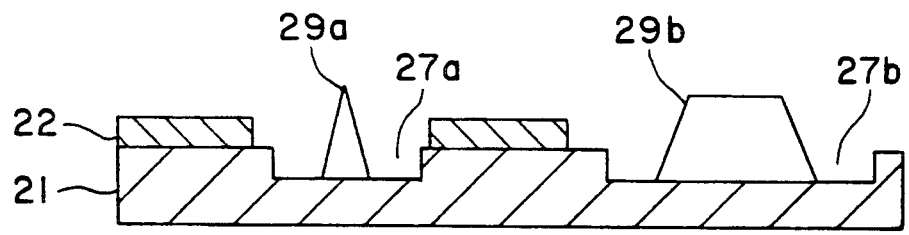

Finally, by acetone and J-100, the PMMA resist film 24 and PMGI resist film 23 are dissolved, and the undesired portion of the Al film 28 is removed by liftoff, so that the structure as shown in FIG. 5(f) is obtained.

Furthermore, a different embodiment is shown below in order to explain, in further detail, the formation of high performance pattern at high reliability by using the developing solution of the invention for developing the PMGI resist film.

In the following embodiment, as an alkaline aqueous solution, NMD-3 of Tokyo Oka Kogyo (2.38 wt. % aqueous solution of tetramethyl ammonium hydroxide), or an organic alkaline developing solution SAL101 of Shipley was used. The SAL101 is a mixed aqueous solution of organic alkali and surfactants. In FIG. 8 and FIG. 9, the initial film thickness of PMGI resist film is 0.85 μm, and the acceleration voltage of the electron beam used in exposure is 25 kV. The temperature of developing solution is 23.5° C. The ratio of mixing is the ratio by volume unless otherwise specified. The organic solvent refers to acetone, ethanol or isopropyl alcohol. The sensitivity curve was obtained by exposing a rectangular pattern of 50 μm × 100 μm by varying the exposure dose, and measuring the remaining film thickness after development.

FIG. 8 shows the electron beam sensitivity curve of the PMGI resist film to a mixed solution of organic solvent, water and alkali.

The solid line in FIG. 8(a) denotes the electron beam sensitivity curve of PMGI resist film to a mixed solution of ethanol, water and NMD-3 at 4:5:1. The dotted line and single-dot chain line are reference data of developing in alkaline aqueous solutions, respectively showing the electron beam sensitivity curves of PMGI resist film to an alkaline aqueous solution of NMD-3 diluted in water at 6:4, and SAL101 (100%). The developing time is 180 seconds.

It is therefore known, when an alkaline aqueous solution and an ethanol-mixed alkaline solution giving similar sensitivity to the PMGI resist film in a same developing time are compared, the gamma value is higher when developed in an ethanol-mixed alkaline solution, that is, a resist pattern of high resolution is formed.

FIG. 8(b) represents an electron beam sensitivity curve of PMGI resist film to a mixed solution of isopropyl alcohol, water and NMD-3 at 4:5:1. The reference data indicated by the dotted line shows the electron beam sensitivity curve of the PMGI resist film to an alkaline aqueous solution of NMD-3 diluted in water at 8:2. The developing time is 180 seconds.

It is known from this result that the gamma value is higher and the reduction of film thickness by development is smaller in the mixed solution of isopropyl alcohol, water and NMD-3 at 4:5:1, than in the alkaline aqueous solution of NMD-3 diluted in water at 8:2.

FIG. 8(c) shows the electron beam sensitivity curve of the PMGI resist film to a mixed solution of acetone, water and NMD-3 at 4:5:1. The dotted line for reference indicates the electron beam sensitivity of PMGI resist film to NMD-3 (100%). The developing time is 30 seconds.

Evidently, the resolution is higher, the sensitivity is higher and film thickness reduction is smaller in the mixed solution of acetone, water and NMD-3 at 4:5:1, than in the developing solution of NMD-3 (100%).

The following facts have been induced from the above results and findings of other experiments.

(1) Although the sensitivity characteristic varies with the type of organic solvent and the mixing rate of components, the higher gamma value is obtained in the alkaline solution mixing an organic solvent, than in the alkaline aqueous solution giving the same sensitivity in the same developing time, in a sensitivity region of 10 to 500 μC/cm².

That is, the remaining film thickness change to the change of exposure dose is greater, and the resolution of the resist film may be set higher.

(2) When the mixing rate of the NMD-3 is constant, as the mixing rate of the organic solvent is higher, the sensitivity is higher, but the gamma value drops.

(3) At a constant ratio by volume of the total volume of water and NMD-3 to the organic solvent, as the mixing rate of NMD-3 is smaller, the sensitivity is lowered and the gamma value increases.

(4) Containing a same organic solvent, when alkaline solutions differing in the mixing rate of organic solvent, water and NMD-3, and giving same sensitivity to PMGI resist in same developing time are compared, the gamma value is higher as the ratio of organic solvent by volume is higher.

(5) Among the organic solvents, ethanol has the greatest effect of enhancing the resolution.

FIG. 9 shows the dependence of the normalized remaining film thickness at the center of the line on the spatial frequency (the inverse number of the sum of the line width and space width), by forming a line-and-space pattern at the 1:1 ratio of the line (the unexposed portion leaving the resist film) width and the space (the portion for selectively removing the resist film by exposure and development) width, by using developing solutions of a mixed solution of ethanol, water and NMD-3 at 4:5:1 in FIG. 8(a), an alkaline aqueous solution of NMD-3 diluted in water at 6:4, and SAL101 (100%).

The axis of ordinates denotes the remaining film rate, and the axis of abscissas represents the spatial frequency, in the unit of $\mu m^{-1}$. The exposure dose is 150 $\mu C/cm^2$ and beam diameter is 0.1 μm in all cases. The developing time is 150 to 210 seconds, and the electron beam sensitivity at acceleration voltage of 25 kV may be set to be 100 $\mu C/cm^2$ in each developing solution.

The solid line is the result of developing in a mixed solution of ethanol, water and NMD-3 at 4:5:1, and the dotted line and the single-dot chain line respectively express the results of developing in an alkaline aqueous solution of NMD-3 diluted in water at 6:4 and SAL101 (100%).

In an alkaline solution mixing ethanol, the normalized remaining film thickness in the line portion is maintained up to the spatial frequency of 1.25 $\mu m^{-1}$ (line-and-space of 0.4 μm), while in an alkaline aqueous solution, the normalized remaining film thickness is dropped suddenly at the spatial frequency of 1.0 $\mu m^{-1}$ or more (line-and-space of 0.5 μm or less). Thus, by developing the PMGI resist film in an alkaline solution containing an organic solvent, a higher resolution than in the conventional development by alkaline aqueous solution may be obtained.

That is, in the conventional alkaline solution, it is hard to resolve a line-and-space pattern of 0.5 μm or less, while in the alkaline solution containing ethanol, a line-and-space pattern of 0.4 μm may be sufficiently resolved.

Thus, according to the invention, a finer pattern than before may be foremd by using PMGI resist film. At the same time, a liftoff process excellent in dimensional controllability and high in reliability than in the prior art will be realized. Besides, in the wet etching process of using the two-layer resist pattern of the invention as the mask on the GaAs substrate, since the adhesion of the lower layer resist to the substrate is superior, the recess width when etching the substrate can be stably controlled, so that a device of high performance may be obtained. Furthermore, in the process of using the PMGI resist film in the lower layer and the PMMA resist film in the upper layer, since the PMMA resist film and PMGI resist film possess mutually appropriate electron beam sensitivity and deep ultraviolet light sensitivity, mixed exposure by electron beam and deep ultraviolet light may be applied, to that a stable hybrid exposure may be effected at a high through-put.

We claim:

1. A pattern forming method comprising:
   a. applying and baking a film consisting of essentially of polydimethyl glutarimide on a substrate,
   b. applying and baking a polymer film having a sensitivity due to chain scission of the polymer caused by charged particle beam or short wavelength electromagnetic waves, on said polydimethyl glutarimide film,
   c. Substantially simultaneously exposing said polymer film and said polydimethyl glutarimide film to said charged particle beam or short wavelength electromagnetic waves in a specified area of two-layer film composed of said polydimethyl glutarimide film and said polymer film,
   d. developing said specified area of said polymer film by using an organic solvent whereby said specified area of polymer film is removed, and
   e. developing said specified area of said polydimethyl glutarimide film by using a solution containing an organic alkali whereby said specified area of polydimethyl glutarimide film is removed.

2. The pattern forming method of claim 1, wherein the baking temperature of said polymer film is lower than the baking temperature of said polydimethyl glutarimide film.

3. The pattern forming method of claim 2, wherein an unexposed portion of said polydimethyl glutarimide film is not dissolved in an organic solvent which is the developing solution of said polymer film.

4. The pattern forming method of claim 2, wherein an exposed portion of said polymer film is not dissolved in a solution containing an organic alkali as the developing solution of said polydimethyl glutarimide film.

5. The pattern forming method of claim 2, wherein the sensitivity of said polymer film is nearly equal to the sensitivity of said polydimethyl glutarimide film.

6. The pattern forming method according to claim 1 wherein the organic alkali is tetramethyl ammonium hydroxide.

7. A pattern forming method comprising:
   a. applying and baking a film consisting essentially of polydimethyl glutarimide on a substrate,
   b. applying and baking a polymer film having a sensitivity due to chain scission of the polymer caused by charged particle beam or short wavelength electromagnetic wave, on said polydimethyl glutarimide film,
   c. substantially simultaneously exposing said polymer film and said polydimethyl glutarimide film to said charged particle beam or short wavelength electromagnetic waves in a specified area of two-layer film composed of said polydimethyl glutarimide film and said polymer film,
   d. developing said specified area of said polymer film by using an organic solvent whereby said specified area of polymer film is removed to provide an opening through said film,
   e. developing said specified area of the polydimethyl glutarimide film by using a solution containing an organic alkali whereby said specified area of polydimethyl glutarimide film is removed to provide an opening through said film,
   wherein the remaining film portion of said polymer film after development is in an overhang shape wherein the opening through said polymer film is broader at the bottom surface than the top surface of said polymer film, and wherein the opening through said polydimethyl glutarimide film is narrower than the opening of the upper part of said polymer film after development.
   f. etching an area of said substrate which is exposed by said developing steps.
   g. depositing a metal film on the entire surface of said substrate, and
   h. removing said polymer film and said polydimethyl glutarimide film.

8. The pattern forming method of claim 7, wherein if said specified area of said polydimethyl glutarimide film has a width of less than 5 $\mu$m, it is exposed with a dose larger than the exposure dose of said specified area having a width of 5 $\mu$m or more, so that said polymer film and said polydimethyl glutarimide film are exposed at the same time.

9. The pattern forming method of claim 7, wherein the region where the width of said specified area of said polydimethyl glutarimide film is 5 $\mu$m or more is irradiated with said charged particle beam or said short wavelength electromagnetic waves, and then the periphery of said specified area is exposed to a dose larger than the exposure dose of the specified portion of 5 $\mu$m or more, so that said polymer film and said polydimethyl glutarimide film are margined and exposed at the same time.

10. A pattern forming method comprising:
    a. applying and baking a film consisting essentially of polydimethyl glutarimide on a substrate,
    b. applying and baking a polymer film having a sensitivity due to chain scission of the polymer caused by charged particle beam or short wavelength electromagnetic wave, on said polydimethyl glutarimide film,
    c. substantially simultaneously exposing said polymer film and said polydimethyl glutarimide film by said charged particle beam or said short wavelength electromagnetic waves in a specified area of said polydimethyl glutarimide film and said polymer film,.
    d. developing said specified area of said polymer film by using an organic solvent whereby said specified area of polymer film is removed,
    e. developing said specified area of said polydimethyl glutarimide film by using a solution containing organic alkali whereby said specified area of polydimethyl glutarimide film is removed,
    wherein a remaining film portion of said polymer film after development is trapezoidal, and the pattern width of said remaining film portion of said polydimethyl glutarimide film after development is narrower than pattern width of the bottom of the trapezoidal shape of said polymer film after development,
    f. etching an area of said substrate which is exposed by said developing steps,
    g. depositing a metal film on the entire surface of said substrate, and
    h. removing said polymer film and said polydimethyl glutarimide film.

11. The pattern forming method according to claim 10 wherein the organic alkali is tetramethyl ammonium hydroxide.

* * * * *